TRANSISTORIZED SQUELCH CIRCUIT FOR AN FM RECEIVER
Filed May 22, 1967
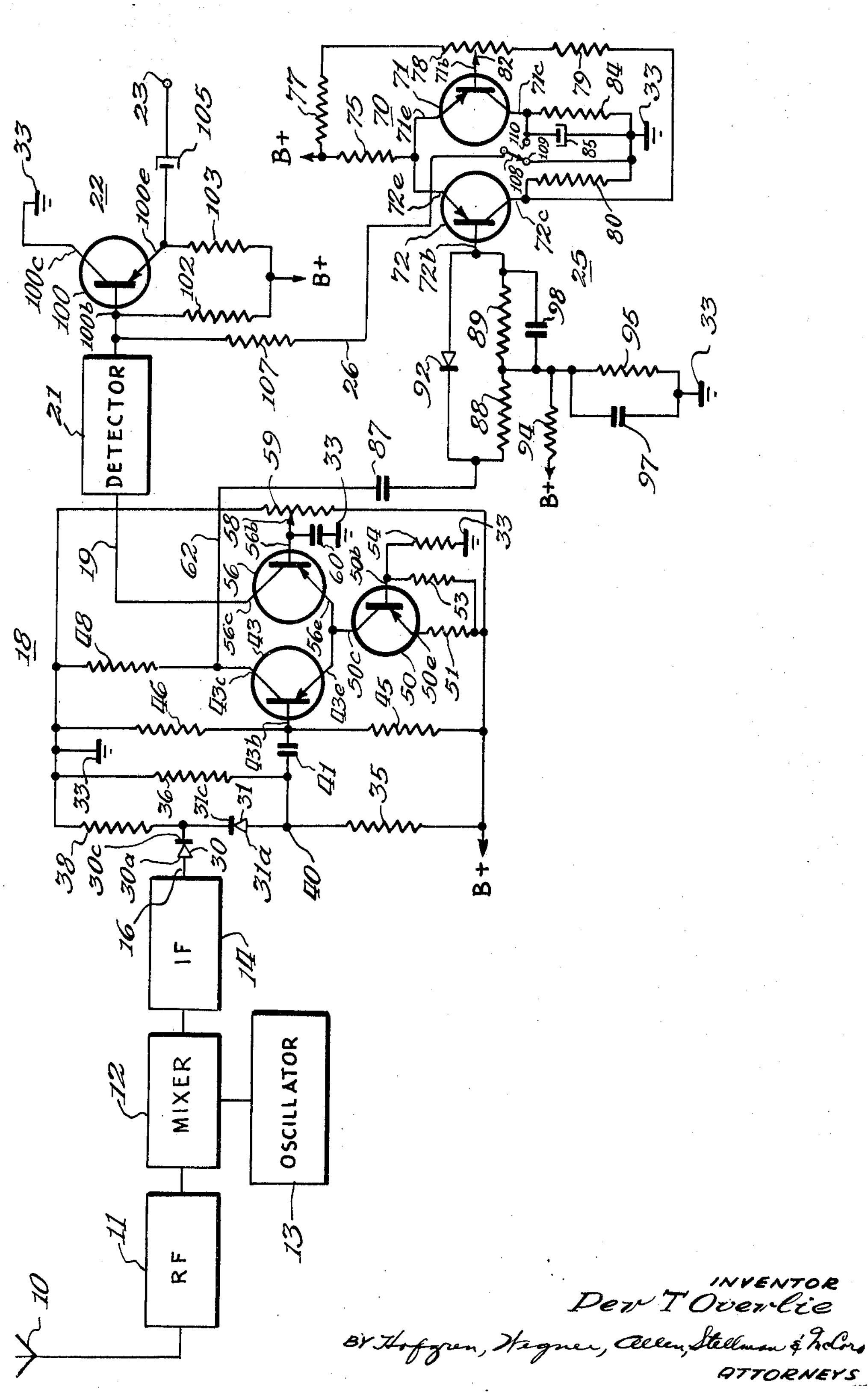
INVENTOR
Dew T Overlie
BY Hofgren, Wegner, Allen, Stellman & McCord
ATTORNEYS

3,509,468
TRANSISTORIZED SQUELCH CIRCUIT FOR AN FM RECEIVER

Per T. Overlie, Chicago, Ill., assignor to Warwick Electronics Inc., a corporation of Delaware Filed May 22, 1967, Ser. No. 639,976
Int. Cl. H04b *15/04*
U.S. Cl. 325—478 4 Claims

ABSTRACT OF THE DISCLOSURE

A squelch circuit is produced for an FM receiver having a biased diode limiter circuit connected to an isolating circuit, said isolating circuit comprising a pair of emitter coupled transistor amplifiers supplied by a constant current source. The isolating circuit has two separate outputs, one which passes the clipped IF signal to a detector and an emitter follower audio amplifier; and a second output which passes a similar signal that controls a fast acting squelch circuit which includes a Schmitt trigger, the conduction state of which controls the biasing of the emitter follower audio amplifier.

Certain aspects of the illustrated circuit are being claimed in a copending application of the applicant, entitled "Limiter Circuit," filed on even date with this application.

This invention relates to a squelch circuit for a radio receiver.

Squelch circuits prevent noise and weak signals from reaching an audio system or speaker of a radio receiver. To have maximum effect, a squelch circuit should be fast acting, i.e., capable of rapidly enabling and disabling the audio system of a receiver. When, for example, a receiver is quickly tuned across a band of frequencies, an insufficiently fast acting squelch circuit may cause certain stations to be missed because the receiver gives no indication through its speaker that any station is present.

One object of this invention is to provide an improved squelch circuit for a radio receiver.

Another object of this invention is to provide a fast acting squelch circuit using electronic trigger control.

One feature of this invention is an improved squelch circuit which activates a Schmit trigger when signals of usable sensitivity are present. The state of the Schmitt trigger controls the conduction of an audio amplifying section of the receiver.

Another feature of the invention is an improved squelch circuit for an FM receiver which obtains its trigger signal from a fast acting diode bias network connected to the limiter section of the receiver.

Further features and advantages of the invention will be apparent from the following specification and from the single figure which is a partly block and partly schematic diagram of a circuit embodying the invention.

While an illustrative embodiment of the invention is shown in the drawing and will be described in detail herein, the invention is susceptible of embodiment in several different forms and it should be understood that the present disclosure is to be considered as an exemplification of the principles of the invention and is not intended to limit the invention to the embodiment illustrated. Throughout the description of the circuit, values and type designations will be given for certain of the components in order to disclose a complete, operative embodiment of the invention. However, the values and type designations are merely illustrative and are not critical unless specifically so stated. The scope of the invention will be pointed out in the appended claims.

In the single figure, the squelch circuit is shown in connection with a transistorized FM receiver. The receiver has an antenna 10 coupled to a radio frequency (RF) amplifying section 11. Amplified RF signals are connected to a mixer 12 and oscillator 13 of suitable design to produce an intermediate frequency (IF) signal at 10.7 megacycles. The IF signal is coupled to an IF amplifying section 14 which has an output 16 connected to a limiter section 18, to be described in detail hereafter. An amplitude limited signal from an output 19 of limiter 18 is connected to a detector 21, which may be of the discriminator type, for recovering the intelligence contained in the FM signal. The resulting detected FM signals is amplified by an audio amplifying section 22 and coupled to an output terminal 23 for connection to additional stages of audio amplification or to a speaker system.

The receiver sections illustrated in block form may be of conventional design and details thereof will not be described further. If desired, the RF and IF amplifying sections 11 and 14 respectively may be of the AGC controlled type, such as disclosed in a copending application of the applicant, entitled "Automatic Gain Control Circuit," Ser. No. 639,978 filed May 22, 1967.

The amplitude limited signal from limiter circuit 18 also controls a squelch circuit 25 having an output at 26 for enabling or disabling audio section 22 in accordance with the strength of the received signal. Certain aspects of the illustrated limiter circuit 18, not relating to use with a squelch circuit, are claimed in the before identified copending application of the applicant, "Limiter Circuit," filed on even date with this application.

Considering the circuit in detail, limiter 18 has first and second diodes 30 and 31 connected in circuit with resistive voltage dividers between a source of positive DC potential or B+, as 11.5 volts, and a source of reference potential or ground 33. More particularly, a 1.8 kilohm resistor 35 and a 3.3 kilohm resistor 36 are connected in series between B+ and ground 33, with the junction therebetween being connected to the anode 31*a* of diode 31. The anode 30*a* of diode 30 is directly connected to the output 16 of IF amplifying section 14. The cathodes 30*c* and 31*c* of diodes 30 and 31 respectively are connected through a common 3.9 kilohm resistor 38 to ground 33. The diode biasing arrangement described above produces, at a junction point 40 between resistor 35 and diode 31, an amplitude limited signal in which both positive and negative going portions of the IF signal are clipped at predetermined levels which cannot be exceeded.

The clipped signal at junction 40 is coupled through a 0.1 microfarad capacitor 41 and through isolation circuit means to the detector 21 and the squelch circuit 25. The isolation circuit prevents detector 21 or squelch circuit 25 from loading the limiter circuit and distoring the clipped waveform. The isolation circuit includes a PNP transistor 43 connected to present a high input impedance to junction point 40. A 5.6 kilohm resistor 45 and a 15 kilohm resistor 46 are connected in series between B+ and ground 33, with the junction therebetween being directly connected to the base 43*b* of transistor 43. The collector 43*c* of transistor 43 is coupled through a one kilohm resistor 48 to ground 33. The emitter 43*e* of transistor 43 is connected to a constant current source.

The constant current source is formed from a PNP transistor 50. A 100 ohm resistor 51 connects the emitter 50*e* of transistor 50 with B+. A 2.7 kilohm resistor 53 and a 39 kilohm resistor 54 are connected in series between B+ and ground 33, with the junction therebetween being connected to the base 50*b* of transistor 50. The collector 50*c* of transistor 50 is directly connected to emitter 43*e*, and to the emitter 56*e* of another PNP transistor 56. The collector 56*c* of transistor 56 directly connects with the output 19 of the limiter. The base 56*b* of transistor 56 is biased by the voltage at a variable tap 58 on a 50 kilohm potentiometer 59, and is bypassed to ground through a 0.1 microfarad capacitor 60. Transistors 43, 50 and 56 may be of the same type, as TI403s.

In operation, transistor 56 has a constant output current for varying collector-to-emitter voltages impressed thereacross, thereby aiding the limiting action of the circuit. The voltage across resistor 48, available between an output lead 62 and ground 33, controls the squelch circuit 25. Thus, limiter circuit 18 provides both a voltage limited signal at 62 for driving the squelch circuit, and a current limited signal at 19 for driving the detector portion of the receiver. For a more detailed explanation of the operation of limiter circuit 18, reference should be made to the before identified copending application of the applicant, entitled "Limiter Circuit," filed on even date with this application.

Squelch circuit 25 is formed from a fast acting switching circuit in the form of a Schmitt trigger 70. Schmitt trigger 70 includes a first and second pair of PNP transistors 71 and 72, operated in either a fully off or a fully on, i.e. saturated, conducting state. A 470 ohm resistor 75 connects B+ to the emitters 71*e* and 72*e* of both transistors 71 and 72. A series connected 4.7 kilohm resistor 77, a 25 kilohm squelch level potentiometer 78, a 33 kilohm resistor 79, and a 3.9 kilohm resistor 80 are connected between B+ and ground 33. Potentiometer 78 has a variable tap 82 thereon which directly connects to the base 71*b* of transistor 71. The junction of resistors 79 and 80 connected directly to the collector 72*c* of transistor 72. The collector 71*c* of transistor 71 is connected to ground 33 through a parallel connected 3.9 kilohm resistor 84 and a 10 microfarad capacitor 85.

Schmitt trigger 70 has a stable state, in which transistor 71 is saturated and transistor 72 is nonconductive, and an unstable state, in which transistor 71 is nonconductive and transistor 72 is saturated. The Schmitt trigger is driven into its unstable state when the signal across resistor 48 in limiter 18 exceeds a predetermined signal level.

Line 62 from resistor 48 is coupled through a 0.05 microfarad capacitor 87 to a fast acting diode network which quickly triggers the Schmitt trigger when the signal exceeds the predetermined squelch level, and recovers in a short time period to allow the Schmitt trigger to quickly return to its stable state when the signal falls below the squelch level. The diode network includes a pair of series connected resistors 88 and 89, ten kilohm and one megohm respectively, connected to the base 72*b* of transistor 72. Resistors 88 and 89 are shunted by a squelch detector diode 92, type 1N295. A voltage divider consisting of a series connected 6.8 kilohm resistor 94 and a 68 kilohm resistor 95 is connected between B+ and ground 33. The junction of resistors 94 and 95 is connected to the junction of resistors 88 and 89. A 0.1 microfarad capacitor 97 shunts resistor 95, while a 5000 micromicrofarad capacitor 98 shunts resistor 89.

The conduction state of transistor 71 in Schmitt trigger 70 controls the signal conduction state of audio amplifying section 22, having an emitter follower connected PNP transistor 100. The collector 100*c* of transistor 100 is directly connected to ground 33. A 150 kilohm resistor 102 and a 2.7 kilohm resistor 103 connect B+ to the base and emitter 100*b* and 100*e* respectively of transistor 100. A 25 microfarad capacitor 105 connects emitter 100*e* with the audio output terminal 23.

Emitter follower transistor 100 is connected to output line 26 from Schmitt trigger 70 through a 100 kilohm resistor 107. Line 26 in turn is connected to a switch 108 which may be thrown between first and second terminals 109 and 110 respectively. Squelch "off" terminal 109 is directly connected to ground 33, while squelch "on" terminal 110 is directly connected to the collector 71*c* of transistor 71.

In operation, squelch circuit 25 becomes effective when switch 108 is moved from the squelch "off" terminal 109 to the squelch "on" terminal 110. Tap 82 of squelch level control 78 is then adjusted so that transistor 71 is in its saturated conduction mode when the receiver is tuned to a station too weak to produce a usable signal for the receiver. Saturated transistor 71 drives transistor 72 into cutoff. Positive voltage from the junction of resistors 94 and 95 is coupled through resistor 89 to base 72*b* of transistor 72, maintaining the Schmitt trigger in its stable state.

The bias voltage of emitter follower transistor 100 is determined by the voltage at the collector 71*c* of transistor 71. When transistor 71 is in its saturated mode, the voltage at base 100*b* of transistor 100 rises in a positive direction, biasing transistor 100 into cut off and attenuating the audio signal from 30 to 40 db.

When the received signal amplitude exceeds the level determined by the setting of tap 82 of potentiometer 78, Schmitt trigger 70 is quickly driven into its unstable state. The signal amplified by transistor 43 of limiter 18 is coupled through capacitor 87 and diode 92, dropping the positive potential existing at base 72*b*. A larger current flows through diode 92 and resistors 88 and 89, producing a greater voltage drop across resistor 89 and dropping the base potential of transistor 72 sufficiently close to ground to drive transistor 72 into its conducting state.

Transistor 71 is now driven into its nonconductive state, and the voltage drop across resistor 84 is negligible. As a result, the voltage at the base of transistor 100 drops, allowing it to function as an emitter follower and pass audio signals with an attenuation of less than 1 db. Should the signal on line 62 again drop below the squelch level. Schmitt trigger 70 will return to its stable state, to disable audio section 22.

I claim:

1. A squelch circuit for a FM receiver including a limiter and an output section, said squelch circuit comprising switching means having an input and an output, said output connected to said output section, isolating circuitry having its input connected to the output of said limiter and having first and second outputs, means connecting said first output of said isolating circuitry to said output section, and network means having an input and output, said input being connected to said second output of said isolating circuitry and said output of said network means being connected to said input of said switching means; said switching means being responsive to said second output of said isolating circuitry exceeding a given level to permit said output section to function and responsive to said second output of said isolating circuitry falling below a given level to prevent the functioning of said output section.

2. The circuit of claim 1 wherein said switching means comprises a Schmitt trigger.

3. The circuit of claim 1 wherein said isolating circuitry includes first and second transistors each having an emitter, collector and base, means coupling the base of said first transistor to the output of said limiter, means coupling the collector of said second transistor to said output section, means coupling said collector of said first transistor to said input of said network means and means connecting the emitters of said first and second transistors to a constant current source to increase the input impedance of said first transistor.

4. The circuit of claim 1 wherein said network means comprises a diode series connected between said input and output of said network means, first and second resistors connected in series shunting said diode, a capacitor being connected between the junction of said first and second resistors and said output, the time constant of the parallel combination of said second resistor and said capacitor being short to provide fast response to a change in received signal level, and means for connecting a reference potential to said junction of said first and second resistors.

References Cited

UNITED STATES PATENTS

| | | | |
|---|---|---|---|
| 2,905,816 | 9/1959 | Buebel | 325—478 XR |
| 2,926,241 | 2/1960 | Goldman | 325—478 XR |
| 3,140,446 | 7/1964 | Myers et al. | 325—478 |
| 3,188,571 | 6/1965 | Michael | 325—402 |
| 3,374,437 | 3/1968 | Heald | 325—402 XR |
| 3,430,147 | 2/1969 | Hennessey et al. | 325—478 XR |

ROBERT L. GRIFFIN, Primary Examiner

C. R. von HELLENS, Assistant Examiner

U.S. Cl. X.R.

307—290; 325—403, 480